United States Patent
Yang

(10) Patent No.: US 9,640,252 B1
(45) Date of Patent: May 2, 2017

(54) METHOD OF OPERATING FLASH MEMORY UNIT

(71) Applicant: Shanghai Huahong Grace Semiconductor Manufacturing Corporation, Shanghai (CN)

(72) Inventor: Guangjun Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 15/226,508

(22) Filed: Aug. 2, 2016

(30) Foreign Application Priority Data

May 26, 2016 (CN) .......................... 2016 1 0361512

(51) Int. Cl.
| | |
|---|---|
| *G11C 16/04* | (2006.01) |
| *G11C 11/56* | (2006.01) |
| *G11C 16/26* | (2006.01) |
| *G11C 16/12* | (2006.01) |
| *H01L 27/11521* | (2017.01) |

(52) U.S. Cl.
CPC ...... *G11C 11/5628* (2013.01); *G11C 11/5635* (2013.01); *G11C 11/5642* (2013.01); *G11C 16/0425* (2013.01); *G11C 16/12* (2013.01); *G11C 16/26* (2013.01); *H01L 27/11521* (2013.01)

(58) Field of Classification Search
CPC .................................................. G11C 16/0408
USPC ..................................................... 365/185.18
See application file for complete search history.

(56) References Cited

U.S. PATENT DOCUMENTS

| | | | | |
|---|---|---|---|---|
| 2004/0130945 A1* | 7/2004 | Sim | ..................... | G11C 16/0425 365/185.2 |
| 2009/0180321 A1* | 7/2009 | Torii | .................. | G11C 16/0433 365/185.05 |
| 2012/0206969 A1* | 8/2012 | Gu | ..................... | H01L 21/28273 365/185.18 |
| 2014/0140132 A1* | 5/2014 | Gu | ......................... | G11C 16/08 365/185.05 |
| 2014/0177333 A1* | 6/2014 | Yang | ........................ | G11C 8/08 365/185.2 |
| 2016/0148942 A1* | 5/2016 | Yang | .................. | G11C 16/0408 365/185.29 |

* cited by examiner

*Primary Examiner* — Min Huang
(74) *Attorney, Agent, or Firm* — Harness, Dickey & Pierce, P.L.C.

(57) ABSTRACT

Method of operating flash memory unit is provided. Flash memory unit includes first and second split-gate flash memory units, source and drain of first split-gate flash memory unit are connected with first and third bit lines respectively, source and drain of second split-gate flash memory unit is connected with second and third bit line respectively, first control gates of two split-gate flash memory units are connected with first control gate line, second control gates of two split-gate flash memory units are connected with second control gate line, word line gates of two split-gate flash memory units are connected with word line, method includes configuring voltages to first and third bit lines, word line, first and second control gate lines to select first storage bit in first split-gate flash memory unit and make first storage bit in to-be-read or to-be-programmed state; suspending second bit line; reading or programming first storage bit.

14 Claims, 2 Drawing Sheets

# METHOD OF OPERATING FLASH MEMORY UNIT

CROSS-REFERENCE TO RELATED APPLICATIONS

This application claims the benefit of priority to Chinese Patent Application No. 201610361512.X, filed on May 26, 2016, the entire disclosure of which is incorporated herein by reference.

TECHNICAL FIELD

The present disclosure generally relates to memory operating technology, and more particularly, to a method of operating a flash memory unit.

BACKGROUND

Flash memories have been popularly used in nonvolatile semiconductor memory technology due to its non-volatility. Flash memories can be classified into two types, including stacked-gate structure and split-gate structure. A stacked-gate structure generally has an over-erase problem, which may increase the complexity of circuit design. Relatively speaking, a split-gate structure effectively avoids an over-erase effect and enables a simplified circuit design. Besides, in the split-gate structure, programming is performed by hot electron injection at a source, which enables higher programming efficiency. Therefore, flash memories with a split-gate structure are widely used in various electronic products, such as smart cards, Subscriber Identity Module (SIM) cards, microcontrollers or mobile phones.

In a flash memory with a split-gate structure, each split-gate flash memory unit includes a source, a drain, a first control gate, a word line gate and a second control gate. To each split-gate flash memory unit, the source and the drain are connected with corresponding bit lines respectively, the word line gate is connected with a word line, and the first and second control gates are connected with corresponding control gate lines respectively.

Operations to the flash memory unit with the split-gate structure include programming, reading and erasing. If the flash memory unit has the split-gate structure where each transistor includes two floating gates, when one of the two floating gates is to be programmed, a positive voltage is applied to the control gate line connected with the one floating fate, and a programming voltage is applied to the bit lines connected with the source and the drain, and to the word line and the control gate connected with the other floating gate which is not programmed. In this way, the one floating gate to be programmed is selected, a current required in the programming is ensured to go through, and electron energy conducted between the source and the drain is increased. When thermions are injected into the one floating gate to be programmed, the programming operation is completed. When a data reading operation is to be performed to the flash memory unit with the split-gate structure, a voltage is applied to the word line, and a current on the word line is read. If the current is relatively large, the read data is 1; or if the current is relatively small, the read data is 0. When no electron is stored in the floating gates, it indicates that the flash memory unit stores data of 1; or when electrons are stored in the floating gates, it indicates that the flash memory unit stores data of 0. When the voltage is applied to the word line, a voltage is also applied to the drain. A current is generated due to movement of a large amount of electrons between the source and the drain. By the bit line detecting the current between the source and the drain, how many electrons are stored in the floating gates is determined, so as to realize reading the data stored in the flash memory unit. When an erasing operation is to be performed to the flash memory unit with the split-gate structure, a positive voltage is applied to the source, and electrons injected into the floating gates are attracted to the source using a tunnel effect between the floating gates and the source, so that no electron is stored in the floating gates any more, that is, erasing is realized.

In existing flash memories with a split-gate structure, to save an area and simplify circuit design, generally, at least two split-gate memory units share a bit line and/or a word line and/or a control gate line.

FIG. 1 schematically illustrates a structural diagram of a flash memory unit with a split-gate structure.

Referring to FIG. 1, the flash memory unit includes a plurality of first split-gate flash memory units 100 and a plurality of second split-gate flash memory units 200. Each first split-gate flash memory unit 100 and each second split-gate flash memory unit 200 may include a source (not shown), a drain (not shown), a first control gate (not shown), a word line gate (not shown) and a second control gate (not shown), respectively. Besides, each first split-gate flash memory unit 100 and each second split-gate flash memory unit 200 includes a first storing bit A and a second storing bit B.

The source of the first split-gate flash memory unit 100 is connected with a first bit line BL0, the source of the second split-gate flash memory unit 200 is connected with a second bit line BL2, the drain of the first split-gate flash memory unit 100 is connected with the drain of the second split-gate flash memory unit 200 and a third bit line BL1, the first control gate of the first split-gate flash memory unit 100 is connected with the first control gate of the second split-gate flash memory unit 200 and a first control gate line CG0, the second control gate of the first split-gate flash memory unit 100 is connected with the second control gate of the second split-gate flash memory unit 200 and a second control gate line CG1, and the word line gate of the first split-gate flash memory unit 100 is connected with the word line gate of the second split-gate flash memory unit 200 and a word line WL.

Referring to FIG. 1, the flash memory unit includes the plurality of first split-gate flash memory units 100 and the plurality of second split-gate flash memory units 200. The plurality of first split-gate flash memory units 100 and the plurality of second split-gate flash memory units 200 share the word line WL, the first control gate line CG0 and the second control gate line CG1. A first pair of first split-gate flash memory unit 100 and second split-gate flash memory unit 200 share the bit line BL1, a second pair of first split-gate flash memory unit 100 and second split-gate flash memory unit 200 share the bit line BL4, an $n^{th}$ pair of first split-gate flash memory unit 100 and second split-gate flash memory unit 200 share the bit line BLk, and so on, which is not described in detail here.

When a reading and/or programming operation is performed to the flash memory unit with the split-gate structure in FIG. 1, for example, to the second storing bit B in the first split-gate flash memory unit 100, a potential difference between the second bit lint BL2 and the third bit line BL1 may result in an electric leakage to cause a leakage current therebetween, which may reduce efficiency and accuracy of the reading and/or programming operations to the second storing bit B in the first split-gate flash memory unit 100.

Therefore, there is a need to improve efficiency and accuracy of reading and programming operations to a flash memory unit.

SUMMARY

In embodiments of the present disclosure, efficiency and accuracy of reading and programming operations to a flash memory unit are improved.

In an embodiment of the present disclosure, a method of operating a flash memory unit is provided, wherein the flash memory unit includes a first split-gate flash memory unit and a second split-gate flash memory unit, wherein each of the first split-gate flash memory unit and the second split-gate flash memory unit includes a source, a drain, a first control gate, a word line gate and a second control gate, the source of the first split-gate flash memory unit is connected with a first bit line, the source of the second split-gate flash memory unit is connected with a second bit line, the drain of the first split-gate flash memory unit is connected with the drain of the second split-gate flash memory unit and a third bit line, the first control gate of the first split-gate flash memory unit is connected with the first control gate of the second split-gate flash memory unit and a first control gate line, the second control gate of the first split-gate flash memory unit is connected with the second control gate of the second split-gate flash memory unit and a second control gate line, and the word line gate of the first split-gate flash memory unit is connected with the word line gate of the second split-gate flash memory unit and a word line, and wherein the method includes: configuring voltages to the first bit line, the third bit line, the word line, the first control gate line and the second control gate line to select a first storage bit in the first split-gate flash memory unit and make the first storage bit in a to-be-read state or a to-be-programmed state; suspending the second bit line; and performing a reading or programming operation to the first storage bit in the first split-gate flash memory unit.

In some embodiments, after the second bit line is suspended, the method may further include: waiting for a predetermined time period to make the second bit line and the third bit line have a same potential.

In some embodiments, when the first storage bit in the first split-gate flash memory unit is farthest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-read state may include: applying a voltage within a range from −1V to 1V to the first bit line, applying a voltage within a range from 0.3V to 1V to the third bit line, applying a voltage within a range from 2V to 5V to the word line, applying a voltage within a range from −1V to 1V to the first control gate line, and applying a voltage within a range from 2V to 5V to the second control gate line, to select the first storage bit in the first split-gate flash memory unit and make a channel current flow in a channel in the first split-gate flash memory unit.

In some embodiments, when the first storage bit in the first split-gate flash memory unit is closest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-read state may include: applying a voltage within a range from 0.3V to 1V to the first bit line, applying a voltage within a range from 0.3V to 1V to the third bit line, applying a voltage within a range from 2V to 5V to the word line, applying a voltage within a range from 2V to 5V to the first control gate line, and applying a voltage within a range from −1V to 1V to the second control gate line, to select the first storage bit in the first split-gate flash memory unit and make a channel current flow in a channel in the first split-gate flash memory unit.

In some embodiments, when the first storage bit in the first split-gate flash memory unit is farthest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-programmed state may include: applying a voltage within a range from 3V to 6V to the first bit line, applying a voltage within a range from 0.1V to 0.5V to the third bit line, applying a voltage within a range from 1V to 2V to the word line, and applying a voltage within a range from 3V to 6V to the second control gate line, to select the first storage bit in the first split-gate flash memory unit and make a channel current flow in a channel in the first split-gate flash memory unit, wherein performing the programming operation to the first storage bit in the first split-gate flash memory unit includes applying a voltage within a range from 6V to 10V to the first control gate line.

In some embodiments, when the first storage bit in the first split-gate flash memory unit is closest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-programmed state may include: applying a voltage within a range from 0.1V to 0.5V to the first bit line, applying a voltage within a range from 3V to 6V to the third bit line, applying a voltage within a range from 1V to 2V to the word line, and applying a voltage within a range from 3V to 6V to the first control gate line, to select the first storage bit in the first split-gate flash memory unit and make a channel current flow in a channel in the first split-gate flash memory unit, wherein performing the programming operation to the first storage bit in the first split-gate flash memory unit includes applying a voltage within a range from 6V to 10V to the second control gate line.

In some embodiments, when the first storage bit in the first split-gate flash memory unit is farthest to the third bit line among all storage bits in the first split-gate flash memory unit, applying a voltage within a range from 0.1V to 0.5V to the third bit line may include: applying a programming current to the third bit line, wherein the programming current makes the voltage within the range from 0.1V to 0.5V be formed on the third bit line.

In some embodiments, when the first storage bit in the first split-gate flash memory unit is closest to the third bit line among all storage bits in the first split-gate flash memory unit, applying a voltage within a range from 0.1V to 0.5V to the first bit line may include: applying a programming current to the first bit line, wherein the programming current makes the voltage within the range from 0.1V to 0.5V be formed on the first bit line.

In some embodiments, the programming current may be within a range from 1 μA to 4 μA.

In some embodiments, if the programming operation is performed to the first storage bit in the first split-gate flash memory unit, before the second bit line is suspended, the method may further include: applying a supply voltage to the second bit line.

In some embodiments, a difference between the voltage applied to the word line and the supply voltage may be smaller than a threshold voltage of the first split-gate flash memory unit.

Compared with the existing techniques, embodiments of the present disclosure may have following advantages. In embodiments of the present disclosure, based on the flash memory unit having an existing structure, voltages are applied to the first bit line, the third bit line, the word line, the first control gate line and the second control gate line to select the first storage bit in the first split-gate flash memory unit and make the first storage bit in a to-be-read state or a to-be-programmed state. Afterwards, the second bit line is suspended. A reading or programming operation is performed to the first storage bit in the first split-gate flash memory unit. By suspending the second bit line, the potentials of the second bit line and the third bit line may become the same, which prevents a leakage current from being produced in the reading or programming operation and improves efficiency and accuracy of the reading or programming operation to the flash memory unit.

Further, if the programming operation is performed to the first storage bit in the first split-gate flash memory unit, before the second bit line is suspended, the method further includes applying a supply voltage to the second bit line. This may make a channel in the second split-gate flash memory unit which is symmetrical to the first split-gate flash memory unit be closed, so that a channel current may not be formed in the second split-gate flash memory unit to prevent a programming operation from being performed to the second split-gate flash memory unit, and the programming operation to the first storage bit in the first split-gate flash memory unit may be implemented more easily.

DETAILED DESCRIPTION

As described in background, in existing techniques, efficiency and accuracy of reading and programming operations to a flash memory unit are relatively low.

Figure 1:
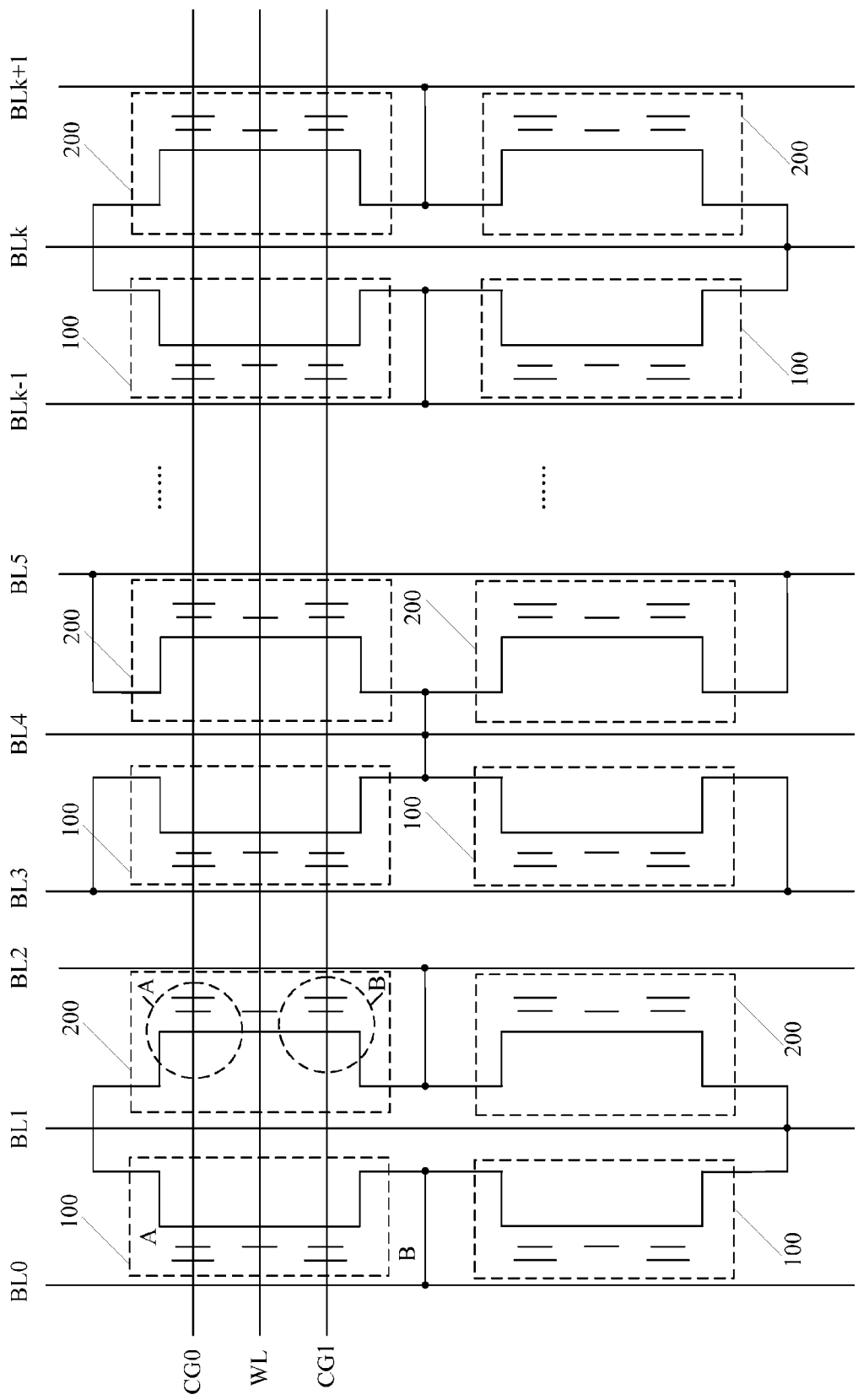
FIG. 1 schematically illustrates a structural diagram of an existing flash memory unit with a split-gate structure.
Figure 2:
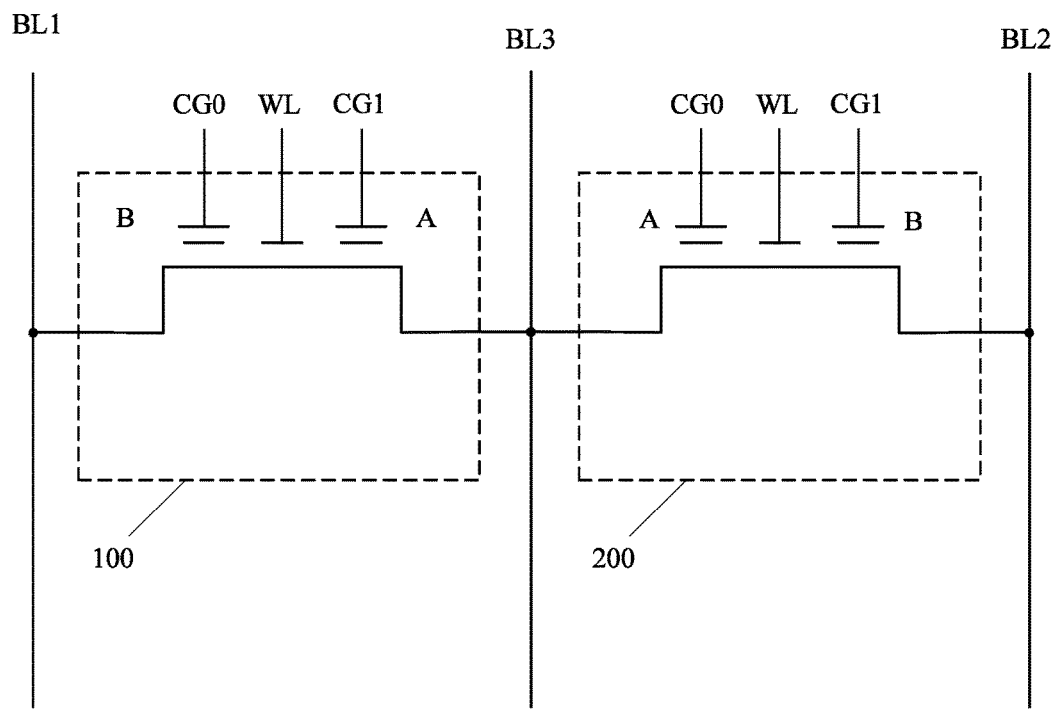
FIG. 2 schematically illustrates a structural diagram of a flash memory unit with a split-gate structure according to an embodiment of the present disclosure.

Inventors have made analysis to the existing techniques. FIG. 2 schematically illustrates a structural diagram of a flash memory unit with a split-gate structure according to an embodiment of the present disclosure. Referring to FIG. 2, the flash memory unit includes a first split-gate flash memory unit 100 and a second split-gate flash memory unit 200, wherein each of the first split-gate flash memory unit 100 and the second split-gate flash memory unit 200 includes a source (not shown), a drain (not shown), a first control gate (not shown), a word line gate (not shown) and a second control gate (not shown). The source of the first split-gate flash memory unit 100 is connected with a first bit line BL1, the source of the second split-gate flash memory unit 200 is connected with a second bit line BL2, the drain of the first split-gate flash memory unit 100 is connected with the drain of the second split-gate flash memory unit 200 and a third bit line BL3, the first control gate of the first split-gate flash memory unit 100 is connected with the first control gate of the second split-gate flash memory unit 200 and a first control gate line CG0, the second control gate of the first split-gate flash memory unit 100 is connected with the second control gate of the second split-gate flash memory unit 200 and a second control gate line CG1, and the word line gate of the first split-gate flash memory unit 100 is connected with the word line gate of the second split-gate flash memory unit 200 and a word line WL.

In existing techniques, when an operation is performed to two storage bits in the second split-gate flash memory unit 200, voltages as shown in Tables 1 and 2 are applied to a control circuit connected with the second split-gate flash memory unit 200.

As shown in Table 1, when a reading operation is performed to a storage bit B in the second split-gate flash memory unit 200, a bias voltage of 0.8V is applied to the first bit line BL1 and the third bit line BL3. However, due to imperfection of circuit, although being applied with the same bias voltage, the first bit line BL1 and the third bit line BL3 may have a potential difference. Besides, voltage configuration to the first control gate line CG0, the second control gate line CG1 and the word line WL causes the first split-gate flash memory unit 100 to be opened, which may result in a channel current in a channel in the first split-gate flash memory unit 100 and further affect efficiency and accuracy of the reading operation to the storage bit B in the second split-gate flash memory unit 200. Similarly, when a programming operation is performed to the storage bit B in the second split-gate flash memory unit 200, a programming current applied to the third bit line BL3 forms a programming voltage which then goes through an emitter follower to form an emitter following programming voltage. The emitter following programming voltage is transmitted to the first bit line BL1. Ideally, potentials of the first bit line BL1 and the third bit line BL3 are the same. However, due to imperfection of the emitter follower, the first bit line BL1 and the third bit line BL3 have a potential difference actually. Besides, voltage configuration to the first control gate line CG0, the second control gate line CG1 and the word line WL causes the first split-gate flash memory unit 100 to be opened, which may result in a channel current in the channel in the first split-gate flash memory unit 100 and further affect efficiency and accuracy of the programming operation to the storage bit B in the second split-gate flash memory unit 200. Therefore, during the operations performed to the storage bit B in the second split-gate flash memory unit 200, an electric leakage caused by the potential difference between the first bit line BL1 and the third bit line BL3 may affect the efficiency and the accuracy of the reading and programming operations to the storage bit B in the second split-gate flash memory unit 200.

TABLE 1

| storage bit A | reading voltage (V) | programming voltage (V) |
| --- | --- | --- |
| BL1 | floating | 2.5 |
| BL3 | 0 | 5.5 |
| BL2 | 0.8 | programming current forms programming voltage |
| CG0 | 0 | 8 |
| WL | 4 | 1.5 |
| CG1 | 4 | 5 |

TABLE 2

| storage bit B | reading voltage (V) | programming voltage (V) |
|---|---|---|
| BL1 | 0.8 | emitter following programming voltage |
| BL3 | 0.8 | programming current forms programming voltage |
| BL2 | 0 | 5.5 |
| CG0 | 4 | 5 |
| WL | 4 | 1.5 |
| CG1 | 0 | 8 |

Based on above analysis, in existing techniques, the efficiency and the accuracy of the reading and programming operations to the flash memory unit are relatively low.

In an embodiment of the present disclosure, a method of operating a flash memory unit is provided. By avoiding an electric leakage in the flash memory unit, efficiency and accuracy of reading and programming operations to the flash memory unit including split-gate flash memory units may be improved.

In order to clarify the objects, characteristics and advantages of the disclosure, embodiments of present disclosure will be described in detail in conjunction with accompanying drawings.

Still referring to FIG. 2, the method may include: configuring voltages to the first bit line BL1, the third bit line BL3, the word line WL, the first control gate line CG0 and the second control gate line CG1 to select a first storage bit in the first split-gate flash memory unit and make the first storage bit in a to-be-read state or a to-be-programmed state; suspending the second bit line BL2; and performing a reading or programming operation to the first storage bit in the first split-gate flash memory unit.

It should be noted that, the first storage bit in the embodiment is not limited to correspond to the storage bit A or the storage bit B in FIG. 2. Besides, as the first split-gate flash memory unit 100 and the second split-gate flash memory unit 200 in FIG. 2 are symmetrical, the first split-gate flash memory unit in the embodiment is not limited to correspond to the first split-gate flash memory unit 100 or the second split-gate flash memory unit 200 in FIG. 2.

Hereinafter, the method is described by taking the storage bit B in the first split-gate flash memory unit 100 as an example.

By suspending the second bit line BL2, the potentials of the second bit line BL2 and the third bit line BL3 may become the same, which avoids an electric leakage caused by a potential difference between the second bit line BL2 and the third bit line BL3 and further prevents a leakage current from being produced in a channel in the second split-gate flash memory unit 200 during the reading or programming operation to the storage bit B in the first split-gate flash memory unit 100. In this way, efficiency and accuracy of the reading or programming operation to the flash memory unit are improved.

In some embodiments, after the second bit line BL2 is suspended, the method may further include: waiting for a predetermined time period to make the second bit line BL2 and the third bit line BL3 have a same potential.

Figure 3:
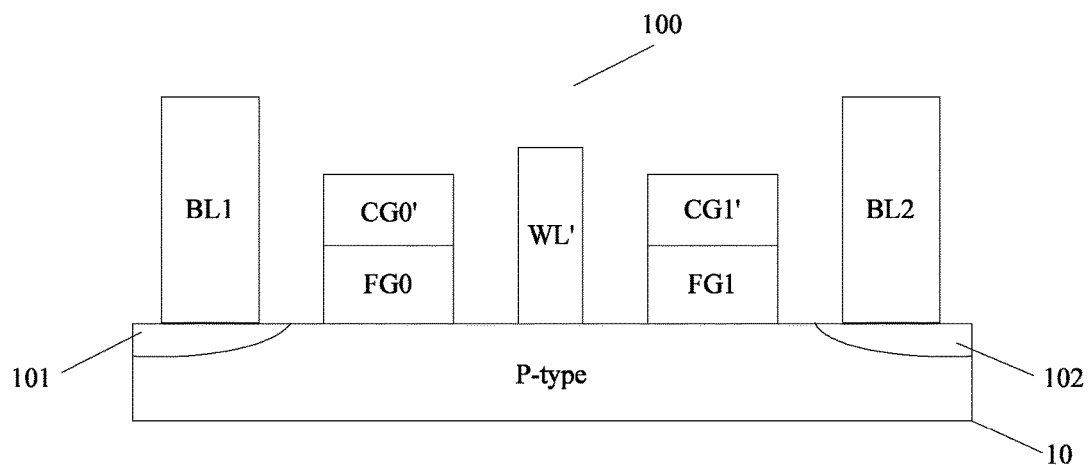
FIG. 3 schematically illustrates a sectional view of a split-gate flash memory unit according to an embodiment of the present disclosure.

FIG. 3 schematically illustrates a sectional view of a split-gate flash memory unit according to an embodiment of the present disclosure.

Referring to FIG. 3, the first split-gate flash memory unit 100 is described for example. In some embodiments, each of the first split-gate flash memory unit 100 and the second split-gate flash memory unit 200 includes a source region 101 and a drain region 102 which are heavily doped N-type regions. The source region 101 is connected with a source (not shown) and the drain region 102 is connected with a drain (not shown). A doped P-type channel region 10 is disposed between the source region 101 and the drain region 102. A surface of the doped P-type channel region 10 is used to form a channel for connecting the source region 101 and the drain region 102.

On the doped P-type channel region 10, a first control gate CG0', a word line gate WL' and a second control gate CG1' are formed. The first control gate CG0', the word line WL' and the second control gate CG1' are disposed between the source region 101 and the drain region 102 successively. The first control gate CG0' and the second control gate CG1' include floating gates FG0 and FG1, respectively.

The first control gate CG0' and the second control gate CG1' are symmetrical with respect to the word line gate WL', and the source region 101 and the drain region 102 are symmetrical.

The source region 101 may be connected with the first bit line BL1, and the drain region 102 may be connected with the second bit line BL2.

In some embodiments, when the first storage bit in the first split-gate flash memory unit 100 is farthest to the third bit line BL3 among all storage bits in the first split-gate flash memory unit 100, that is, the first storage bit in the first split-gate flash memory unit 100 is the storage bit B in FIG. 2, configuring voltages to the first bit line BL1, the third bit line BL3, the word line WL, the first control gate line CG0 and the second control gate line CG1 to select the first storage bit in the first split-gate flash memory unit 100 and make the first storage bit in a to-be-read state may include: applying a voltage within a range from −1V to 1V to the first bit line BL1, applying a voltage within a range from 0.3V to 1V to the third bit line BL3, applying a voltage within a range from 2V to 5V to the word line WL, applying a voltage within a range from −1V to 1V to the first control gate line CG0, and applying a voltage within a range from 2V to 5V to the second control gate line CG1, to select the first storage bit in the first split-gate flash memory unit 100 and make a channel current flow in a channel in the first split-gate flash memory unit 100.

It should be noted that, an order of applying voltages to the first bit line BL1, the third bit line BL3, the word line WL, the first control gate line CG0 and the second control gate line CG1 is not limited in embodiments of the present disclosure.

In some embodiments, a voltage of 0V is applied to the first bit line BL1, a voltage of 0.8V is applied to the third bit line BL3, a voltage of 4V is applied to the word line WL, a voltage of 0V is applied to the first control gate line CG0, and a voltage of 4V is applied to the second control gate line CG1.

In some embodiments, when the first storage bit in the first split-gate flash memory unit 100 is closest to the third bit line BL3 among all storage bits in the first split-gate flash memory unit 100, that is, the first storage bit in the first split-gate flash memory unit 100 is the storage bit A in FIG. 2, configuring voltages to the first bit line BL1, the third bit line BL3, the word line WL, the first control gate line CG0 and the second control gate line CG1 to select the first storage bit in the first split-gate flash memory unit 100 and make the first storage bit in a to-be-read state may include: applying a voltage within a range from 0.3V to 1V to the first bit line BL1, applying a voltage within a range from 0.3V to 1V to the third bit line BL3, applying a voltage within a range from 2V to 5V to the word line WL, applying a voltage within a range from 2V to 5V to the first control gate line CG0, and applying a voltage within a range from −1V to 1V to the second control gate line CG1, to select the first storage bit in the first split-gate flash memory unit 100 and make a channel current flow in a channel in the first split-gate flash memory unit 100.

It should be noted that, an order of applying voltages to the first bit line BL1, the third bit line BL3, the word line WL, the first control gate line CG0 and the second control gate line CG1 is not limited in the above embodiments of the present disclosure as well.

In some embodiments, a voltage of 0.8V is applied to the first bit line BL1, a voltage of 0.8V is applied to the third bit line BL3, a voltage of 4V is applied to the word line WL, a voltage of 4V is applied to the first control gate line CG0, and a voltage of 0V is applied to the second control gate line CG1.

In some embodiments, when the first storage bit in the first split-gate flash memory unit 100 is farthest to the third bit line BL3 among all storage bits in the first split-gate flash memory unit 100, that is, the first storage bit in the first split-gate flash memory unit 100 is the storage bit B in FIG. 2, configuring voltages to the first bit line BL1, the third bit line BL3, the word line WL, the first control gate line CG0 and the second control gate line CG1 to select the first storage bit in the first split-gate flash memory unit 100 and make the first storage bit in a to-be-programmed state may include: applying a voltage within a range from 3V to 6V to the first bit line BL1, applying a voltage within a range from 0.1V to 0.5V to the third bit line BL3, applying a voltage within a range from 1V to 2V to the word line WL, and applying a voltage within a range from 3V to 6V to the second control gate line CG1, to select the first storage bit in the first split-gate flash memory unit 100 and make a channel current flow in a channel in the first split-gate flash memory unit 100.

In some embodiments, performing the programming operation to the first storage bit in the first split-gate flash memory unit 100 includes applying a voltage within a range from 6V to 10V to the first control gate line CG0.

It should be noted that, an order of applying voltages to the first bit line BL1, the third bit line BL3, the word line WL and the second control gate line CG1 is not limited in the above embodiments of the present disclosure.

In some embodiments, a voltage of 5.5V is applied to the first bit line BL1, a voltage of 0.2V is applied to the third bit line BL3, a voltage of 1.5V is applied to the word line WL, a voltage of 5V is applied to the second control gate line CG1, and a voltage of 8V is applied to the first control gate line CG0.

In some embodiments, applying a voltage within a range from 0.1V to 0.5V to the third bit line BL3 may include: applying a programming current to the third bit line BL3, wherein the programming current makes the voltage within the range from 0.1V to 0.5V be formed on the third bit line BL3.

In some embodiments, when the first storage bit in the first split-gate flash memory unit 100 is closest to the third bit line BL3 among all storage bits in the first split-gate flash memory unit 100, that is, the first storage bit in the first split-gate flash memory unit 100 is the storage bit A in FIG. 2, configuring voltages to the first bit line BL1, the third bit line BL3, the word line WL, the first control gate line CG0 and the second control gate line CG1 to select the first storage bit in the first split-gate flash memory unit 100 and make the first storage bit in a to-be-programmed state may include: applying a voltage within a range from 0.1V to 0.5V to the first bit line BL1, applying a voltage within a range from 3V to 6V to the third bit line BL3, applying a voltage within a range from 1V to 2V to the word line WL, and applying a voltage within a range from 3V to 6V to the first control gate line CG0, to select the first storage bit in the first split-gate flash memory unit 100 and make a channel current flow in a channel in the first split-gate flash memory unit 100.

In some embodiments, performing the programming operation to the first storage bit in the first split-gate flash memory unit 100 includes applying a voltage within a range from 6V to 10V to the second control gate line CG1.

In some embodiments, a voltage of 0.2V is applied to the first bit line BL1, a voltage of 5.5V is applied to the third bit line BL3, a voltage of 1.5V is applied to the word line WL, a voltage of 5V is applied to the first control gate line CG0, and a voltage of 8V is applied to the second control gate line CG1.

It should be noted that, an order of applying voltages to the first bit line BL1, the third bit line BL3, the word line WL and the first control gate line CG0 is not limited in the above embodiments of the present disclosure.

In some embodiments, applying a voltage within a range from 0.1V to 0.5V to the first bit line BL1 may include: applying a programming current to the first bit line BL1, wherein the programming current makes the voltage within the range from 0.1V to 0.5V be formed on the first bit line BL1.

In some embodiments, the programming current may be within a range from 1 μA to 4 μA which can make the channel in the first split-gate flash memory unit 100 have enough electrons therein to facilitate the programming operation.

In some embodiments, if the programming operation is performed to the first storage bit (taking the storage bit A as an example) in the first split-gate flash memory unit 100, before the second bit line BL2 is suspended, the method may further include: applying a supply voltage to the second bit line BL2.

In some embodiments, a difference between the voltage applied to the word line WL and the supply voltage may be smaller than a threshold voltage Vth of the first split-gate flash memory unit 100.

In some embodiments, when the programming operation is performed to the first storage bit in the first split-gate flash memory unit 100, the voltage applied to the word line WL may be 1.5V, and the supply voltage applied to the second bit line BL2 may be 1.5V, to make a channel in the second split-gate flash memory unit 200 which is symmetrical to the first split-gate flash memory unit 100 be closed, so that a channel current may not be formed in the second split-gate flash memory unit 200 to prevent a programming operation from being performed to the second split-gate flash memory unit 200 and further to avoid programming crosstalk.

It should be noted that, in embodiments of the present disclosure, the voltages applied to the first split-gate flash memory unit 100 and/or the second split-gate flash memory unit 200 are relative values with respect to a grounded signal of the flash memory unit.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A method of operating a flash memory unit,
wherein the flash memory unit comprises a first split-gate flash memory unit and a second split-gate flash memory unit,
wherein each of the first split-gate flash memory unit and the second split-gate flash memory unit comprises a source, a drain, a first control gate, a word line gate and a second control gate, the source of the first split-gate flash memory unit is connected with a first bit line, the source of the second split-gate flash memory unit is connected with a second bit line, the drain of the first split-gate flash memory unit is connected with the drain of the second split-gate flash memory unit and a third bit line, the first control gate of the first split-gate flash memory unit is connected with the first control gate of the second split-gate flash memory unit and a first control gate line, the second control gate of the first split-gate flash memory unit is connected with the second control gate of the second split-gate flash memory unit and a second control gate line, and the word line gate of the first split-gate flash memory unit is connected with the word line gate of the second split-gate flash memory unit and a word line, and
wherein the method comprises:
configuring voltages to the first bit line, the third bit line, the word line, the first control gate line and the second control gate line to select a first storage bit in the first split-gate flash memory unit and make the first storage bit in a to-be-read state or a to-be-programmed state;
suspending the second bit line; and
performing a reading or programming operation to the first storage bit in the first split-gate flash memory unit.

2. The method according to claim 1, wherein after the second bit line is suspended, the method further comprises: waiting for a predetermined time period to make the second bit line and the third bit line have a same potential.

3. The method according to claim 1, wherein when the first storage bit in the first split-gate flash memory unit is farthest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-read state comprises:
applying a voltage within a range from −1V to 1V to the first bit line, applying a voltage within a range from 0.3V to 1V to the third bit line, applying a voltage within a range from 2V to 5V to the word line, applying a voltage within a range from −1V to 1V to the first control gate line, and applying a voltage within a range from 2V to 5V to the second control gate line, to select the first storage bit in the first split-gate flash memory unit and make a channel current flow in a channel in the first split-gate flash memory unit.

4. The method according to claim 1, wherein when the first storage bit in the first split-gate flash memory unit is closest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-read state comprises:
applying a voltage within a range from 0.3V to 1V to the first bit line, applying a voltage within a range from 0.3V to 1V to the third bit line, applying a voltage within a range from 2V to 5V to the word line, applying a voltage within a range from 2V to 5V to the first control gate line, and applying a voltage within a range from −1V to 1V to the second control gate line, to select the first storage bit in the first split-gate flash memory unit and make a channel current flow in a channel in the first split-gate flash memory unit.

5. The method according to claim 1, wherein when the first storage bit in the first split-gate flash memory unit is farthest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-programmed state comprises:
applying a voltage within a range from 3V to 6V to the first bit line, applying a voltage within a range from 0.1V to 0.5V to the third bit line, applying a voltage within a range from 1V to 2V to the word line, and applying a voltage within a range from 3V to 6V to the second control gate line, to select the first storage bit in the first split-gate flash memory unit and make a channel current flow in a channel in the first split-gate flash memory unit, wherein performing the programming operation to the first storage bit in the first split-gate flash memory unit comprises applying a voltage within a range from 6V to 10V to the first control gate line.

6. The method according to claim 1, wherein when the first storage bit in the first split-gate flash memory unit is closest to the third bit line among all storage bits in the first split-gate flash memory unit, configuring voltages to the first bit line, the third bit line, the word line, the first control gate line and the second control gate line to select the first storage bit in the first split-gate flash memory unit and make the first storage bit in a to-be-programmed state comprises:
applying a voltage within a range from 0.1V to 0.5V to the first bit line, applying a voltage within a range from 3V to 6V to the third bit line, applying a voltage within a range from 1V to 2V to the word line, and applying a voltage within a range from 3V to 6V to the first control gate line, to select the first storage bit in the first split-gate flash memory unit and make a channel current flow in a channel in the first split-gate flash memory unit, wherein performing the programming operation to the first storage bit in the first split-gate flash memory unit comprises applying a voltage within a range from 6V to 10V to the second control gate line.

7. The method according to claim 5, wherein when the first storage bit in the first split-gate flash memory unit is farthest to the third bit line among all storage bits in the first split-gate flash memory unit, applying a voltage within a range from 0.1V to 0.5V to the third bit line comprises: applying a programming current to the third bit line, wherein the programming current makes the voltage within the range from 0.1V to 0.5V be formed on the third bit line.

8. The method according to claim 6, wherein when the first storage bit in the first split-gate flash memory unit is closest to the third bit line among all storage bits in the first split-gate flash memory unit, applying a voltage within a range from 0.1V to 0.5V to the first bit line comprises: applying a programming current to the first bit line, wherein the programming current makes the voltage within the range from 0.1V to 0.5V be formed on the first bit line.

9. The method according to claim 7, wherein the programming current is within a range from 1 µA to 4 µA.

10. The method according to claim 8, wherein the programming current is within a range from 1 μA to 4 μA.

11. The method according to claim 5, wherein if the programming operation is performed to the first storage bit in the first split-gate flash memory unit, before the second bit line is suspended, the method further comprises: applying a supply voltage to the second bit line.

12. The method according to claim 6, wherein if the programming operation is performed to the first storage bit in the first split-gate flash memory unit, before the second bit line is suspended, the method further comprises: applying a supply voltage to the second bit line.

13. The method according to claim 11, wherein a difference between the voltage applied to the word line and the supply voltage is smaller than a threshold voltage of the first split-gate flash memory unit.

14. The method according to claim 12, wherein a difference between the voltage applied to the word line and the supply voltage is smaller than a threshold voltage of the first split-gate flash memory unit.

\* \* \* \* \*